United States Patent [19]

Cosenza

[11] Patent Number: 4,534,234
[45] Date of Patent: Aug. 13, 1985

[54] FASTENER OF THE HOLD-DOWN TYPE
[75] Inventor: Frank J. Cosenza, San Pedro, Calif.
[73] Assignee: Rexnord Inc., Brookfield, Wis.
[21] Appl. No.: 569,932
[22] Filed: Jan. 11, 1984

Related U.S. Application Data

[63] Continuation of Ser. No. 287,613, Jul. 28, 1981, abandoned.

[51] Int. Cl.³ .............................................. F16H 27/02
[52] U.S. Cl. .................................. 74/89.15; 339/91 R
[58] Field of Search ...................... 74/89.15, 99 A, 56;
339/91 R; 312/320; 248/507, 361 R, 500

[56] References Cited

U.S. PATENT DOCUMENTS

| | | | |
|---|---|---|---|
| 1,808,901 | 6/1931 | McGerry et al. | 74/56 |
| 2,901,279 | 8/1959 | MacNaught | 292/256.5 |
| 3,316,456 | 4/1967 | Barlow | 317/100 |
| 3,432,197 | 3/1969 | Albertine et al. | 287/189.36 |
| 3,480,248 | 11/1969 | Lucchino et al. | 248/507 |
| 3,640,141 | 2/1972 | Hollingsead et al. | 74/89.15 |
| 3,734,444 | 5/1973 | Thorngate | 248/316 R |
| 3,796,985 | 3/1974 | Weber | 339/91 R |
| 3,866,878 | 2/1975 | Yamamoto | 248/500 |
| 3,872,734 | 3/1975 | Reithmeier | 74/89.15 |
| 4,018,091 | 4/1977 | Hollingsead et al. | 74/89.15 |

FOREIGN PATENT DOCUMENTS

| | | |
|---|---|---|
| 1800200 | 8/1970 | Fed. Rep. of Germany . |
| 2112587 | 10/1972 | Fed. Rep. of Germany . |
| 2114451 | 6/1972 | France . |
| 246334 | 9/1947 | Switzerland . |

OTHER PUBLICATIONS

"Soviet Inventions Illustrated", Week C20, Jun. 25, 1980, Section Q61, SU-A-685 848, Karpenko G.E. (one page).
IBM Technical Disclosure Bulletin, vol. 22, No. 4, Sep. 1979, New York, J. A. Dickerson, et al., "Latching Mechanisms", pp. 1580-1581.

Primary Examiner—Robert P. Swiatek
Assistant Examiner—James Hakomaki

[57] ABSTRACT

A fastener of the hold-down type provides for the insertion and extraction of modular units positioned on a shelf. The fastener has a slip clutch which operates to prevent the fastener from exceeding a predetermined load and a keeper member rotatable in either direction to alternately secure and release the fastener from a hook element on the modular unit.

8 Claims, 13 Drawing Figures

FASTENER OF THE HOLD-DOWN TYPE

This application is a continuation of application Ser. No. 287,613, filed 7-28-81, abandoned.

BACKGROUND OF THE INVENTION

1. Field of the Invention

The present invention relates to a fastening device for securing and displacing moveable units to support structure.

2. Description of the Prior Art

With the advent of light weight and miniaturized electronic components, the aircraft industry has developed modular electronic units which can be readily inserted and removed from support structure built into the aircraft. Repairs can thus be made to units at facilities removed from the aircraft. To facilitate quick removal and replacement of such units, various types of fastening devices are employed. Examples of such fastening units may be seen in U.S. Pat. Nos. 3,640,141; 3,866,878; and 4,018,091. All of the fastening devices firmly secure the units to the support structure. U.S. Pat. Nos. 3,640,141 and 4,018,091 additionally describe a fastener device which displaces the unit to and from the operable seated position within the frame structure.

A continued problem plaguing the aircraft industry is the paramount need to reduce the weight of the aircraft. As the cost of aviation fuel increases, the economic pressure exerted on the industry continues to mount necessitating critical analysis of the various aircraft parts to determine where weight savings can be made. It is also imperative that the savings must be made without sacrifice to quality or function of the parts.

The myriads of fastening devices aboard aircraft have been identified as particularly attractive candidates for weight reduction. Although each individually may weigh in some instances less than a gram to more than a kilogram, the collective reduction along with other component weight reduction may be significant. The prior art fastener devices mentioned above while functioning admirably would be much more acceptable if some weight reduction could be accomplished.

SUMMARY OF THE INVENTION

The present invention comprises a lightweight fastener device which not only secures a module unit to a support apparatus but displaces the unit to and from its seated position (i.e. position in which the module becomes operative) so as to facilitate rapid replacement of a unit which may need service or has been technically outmoded by a newer more advanced module. The fastener device, in combination with the module cover and supporting structure, includes a hinge element, a portion of which is fixed to the supporting structure and a link pivotable to the fixed portion; a shaft which is pivotably connected at one end to the link element; a sleeve which is rotatably mounted on the shaft; and a keeper which is mounted for free rotational movement about the shaft and functions to secure a leg of a hook fixed to the unit when in one rotative position. The hinge and link element provide for ease of securing the keeper about the leg of the modular unit hook by permitting fastener device to be inserted in at a high angle to the horizontal.

The sleeve and keeper are mounted so as to provide relative longitudinal movement therebetween when the keeper abuts the leg of the module unit. Cessation of the longitudinal movement indicates that a predetermined load is being approached and free rotation of the sleeve indicates that the predetermined load has been reached.

An extractor element is also mounted on the shaft and is fixed relative to the longitudinal movement of the keeper. The extractor element functions to displace the unit away from its seated position as the sleeve is rotated in a counter-clockwise direction.

The appended claims provide the appropriate boundary to the features of the present invention which is described in more detail by the following description and accompanying drawings.

BRIEF DESCRIPTION OF THE DRAWINGS

FIG. 6b is a top view of the fastener of FIG. 6a.

FIG. 6c is a bottom view of the fastener of FIG. 6a.

DETAILED DESCRIPTION OF THE PREFERRED EMBODIMENT

Figure 1:
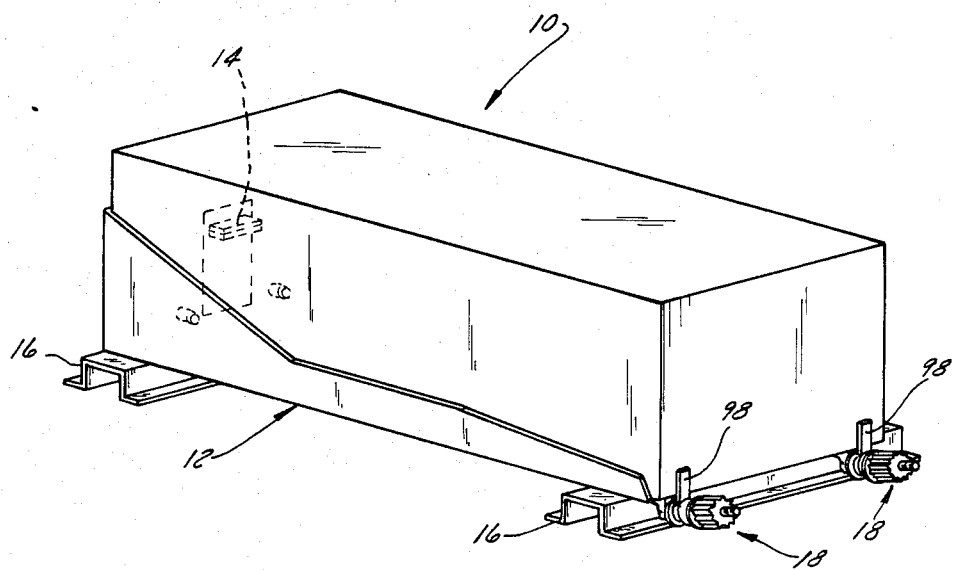
FIG. 1 is a perspective view of a module unit fastened with fasteners of the present invention.

The perspective drawing of FIG. 1 generally illustrates a modular unit 10 of any function which is adapted to be positioned on a support shelf 12. When in its seated position, unit 10 receives electrical connectors 14 shown in phantom which permits unit 10 to become functional. Shelf 12 is shown supported by two cross members 16, shown strictly for illustrative purposes, as the type of supporting structure is purely arbitrary and forms no part of the present invention.

Attached to the shelf are paired swing fasteners 18 which, as will be discussed, serve to secure unit 10 to shelf 12 in the seated position and displace the unit to and from the seated position. The precise number of swing fasteners used to hold a unit is a matter of choice, but is traditionally two as shown.

Figure 2:
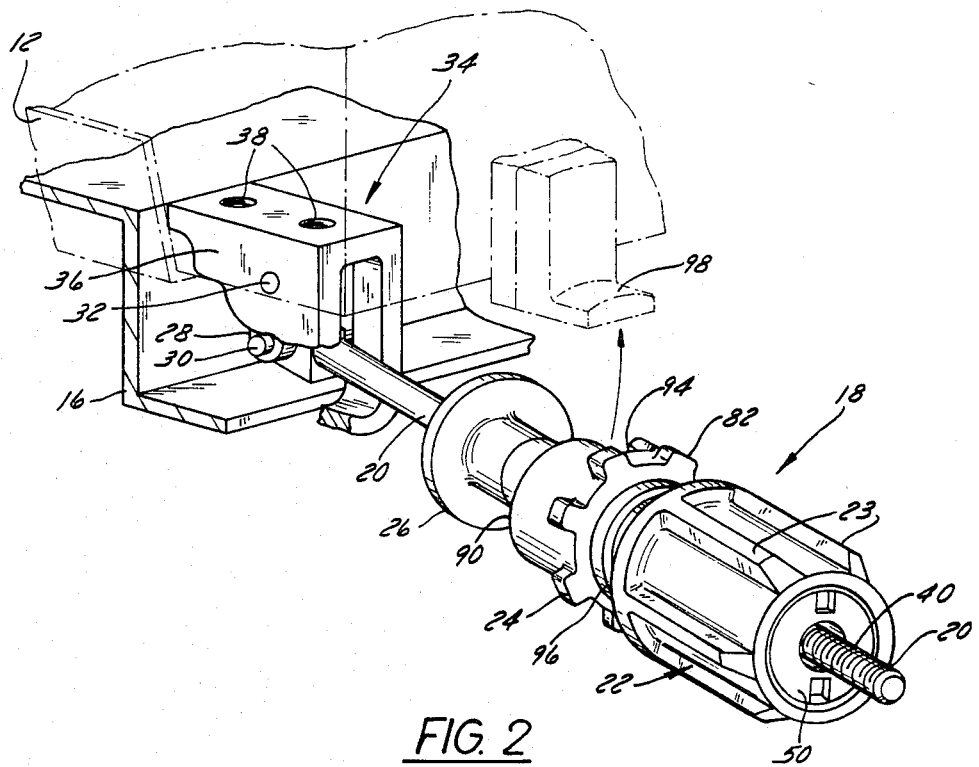
FIG. 2 is an isometric view illustrating the connection of the fastener shaft to the supporting structure.

FIG. 2 perhaps best illustrates the major exterior components of fastener 18. Each fastener 18 comprises a shaft 20 about which is mounted a rotatable sleeve 22, a freely rotating keeper 24, and an extractor 26. Shaft 20 is pivotably connected to link 28 by pin 30. Link 28 is pivotably connected via pin 32 to the side walls 36 of fixed element 34 in turn secured by bolts 38 to the under surface of shelf 12.

Sleeve 22 is provided with a plurality of longitudinally running splines 23 which facilitate manual gripping of sleeve 22. However, any friction inducing material may be employed as well.

Figure 3:
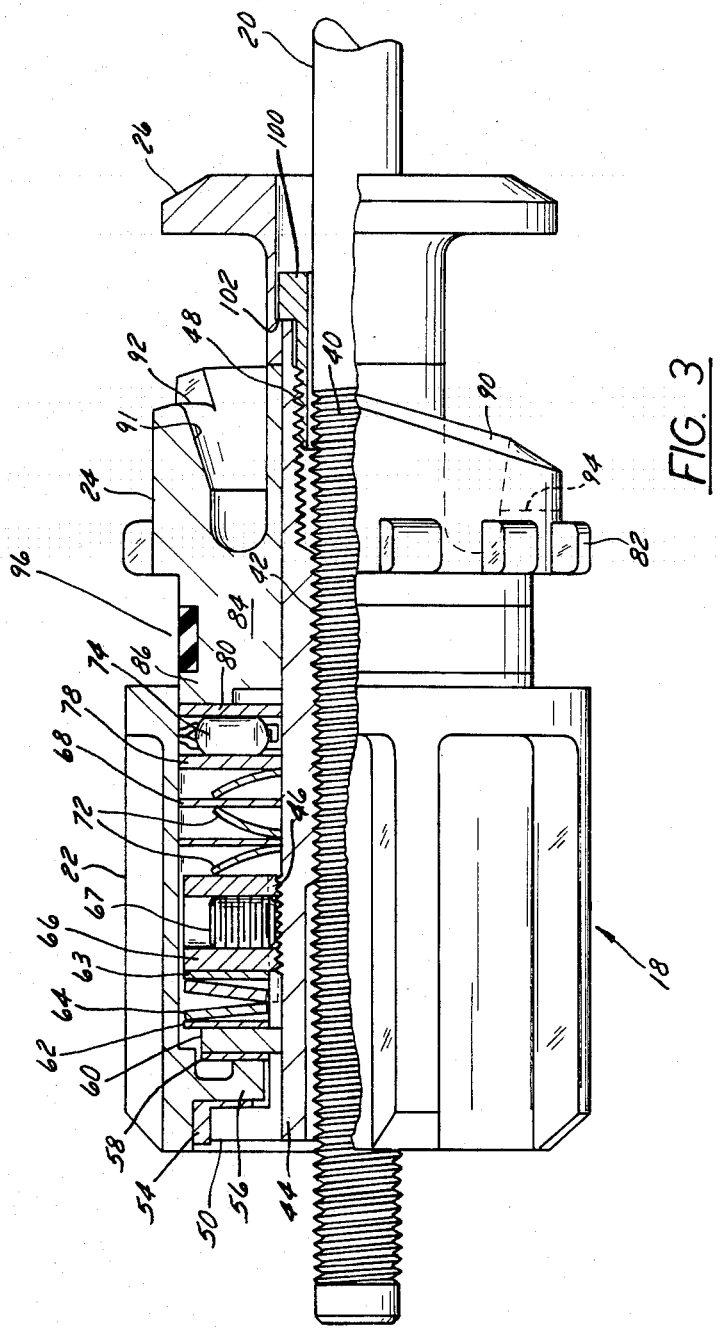
FIG. 3 is an enlarged side-sectional view of the fastener of the present invention.

FIG. 3, in side section, depicts the details of the clutch and spring arrangement. Central shaft 20 has threads 40 and is complimentary to and receives threads 42 of hollow central drive shaft 44. Shaft 44 has two additional threaded portions 46 and 48 for purposes to be discussed. Head 50 of shaft 44 abuts a wear cup 54 which in turn are fitted against annular projection 56 of sleeve 22. The opposite surface of projection 56 is positioned against the slip-clutch assembly comprised of clutch 58, clutch plate 60, and washer 62.

Behind washer 62 is positioned one or more belleville washers 64 and a washer 63. A threaded disc or adjustor 66 is located on the opposite side of washer 63. Adjustor 66 which can be rotated along threads 46 of shaft 44 permits preload adjustment to washers 64 to insure the necessary load requirements are met. To prevent any inadvertent rotation of adjustor 66, a set screw 67 locked into shaft 44 is located on the adjustor 66. Adjacent to adjustor 66 are a series of curved washers 72, disc washers 68, and thrust bearing 74, positioned between two plates 78, 80 which during operation deflect keeper 24 rearward until it firmly abuts the module. Curved washers 72 are compressible and permit keeper 24 to move relative to and glide inside of sleeve 22.

Figure 4:
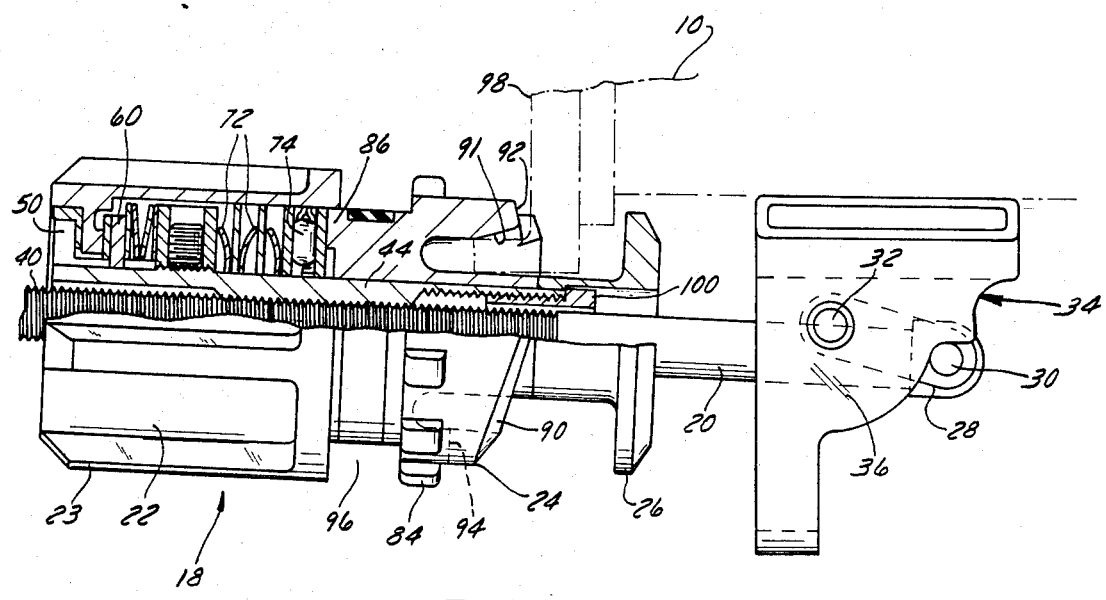
FIG. 4 is a side-sectional view of the fastener of the present invention in its unlocked position.
Figure 5:
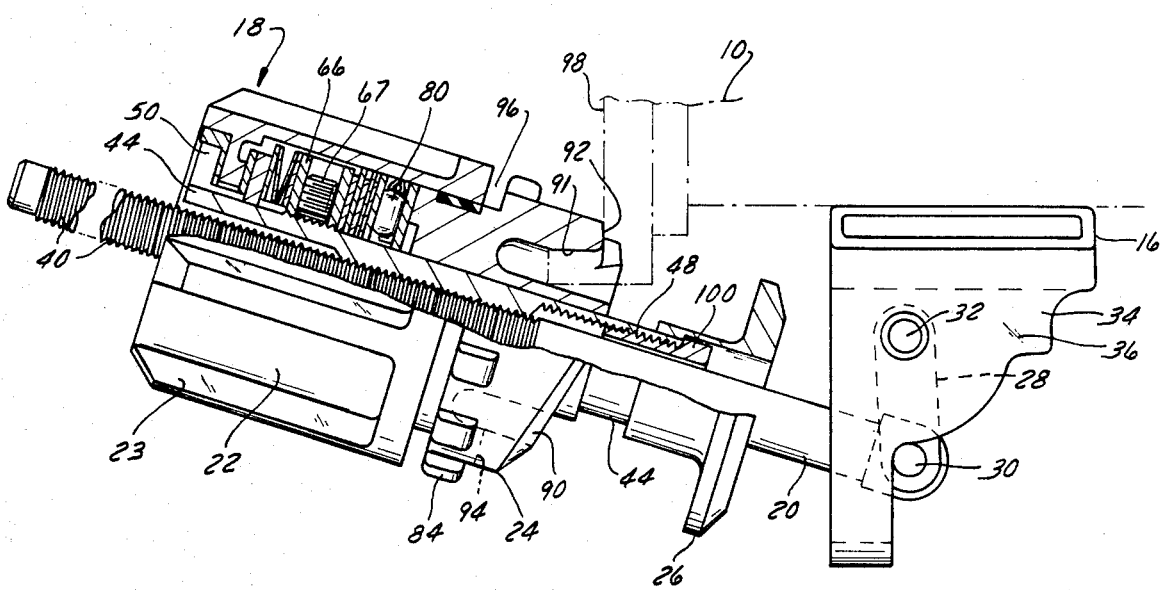
FIG. 5 is a side-sectional view of the fastener of the present invention in its locked or loaded position.

FIGS. 4 and 5 respectively show the fastener 18 in partial side section when still attached to unit 10 but in an unloaded condition and when in its loaded condition. It should be noted that in the loaded condition curved washers 72 are compressed. This and other relationships will be discussed in connection with the operation of fastener 18 to be described. The sidewalls 36 of element 34 are integral and do form a U-shaped section facing fastener 18. Additionally walls 36 are cut away to permit unimpeded movement of link 28 and pin 30.

Reference is now made to FIG. 3 and then to FIGS. 6-10 which illustrate sequentially the operation of fastener unit 18 with particular emphasis on the advantageous function of keeper 24. The isometric view of FIG. 6a displays unit 18 in its free state with shaft 20 resting against the U-shaped curvature of element 34. Keeper 24 takes the general form of an annular cylinder which is positioned on and freely rotates about shaft 44. A raised ring or knob 82 accommodates manual rotation of keeper 24.

As seen in FIG. 3, region 84 of keeper 24 contacts plate 80 along an extension 86. The small area contact removed from shaft 44 ensures the load (resulting when fastener 18 is secured) is passed to shaft 44 along the longest moment arm possible. Also in FIG. 3, it should be noticed that extractor 26 abuts keeper 24 and is partly maintained in such a relationship by threaded tubular nut 100 which is threadedly engaged with central shaft 44 along threads 48. The head of nut 100 abuts a small downward projecting ledge 102 of extractor 26. When nut 100 is tightly threaded into position, the abutting relationship with ledge 102 normally maintains the contact between extractor 26 and keeper 24 except, as described below, when fastener 18 is in its secured or fastened position.

Figure 6A:
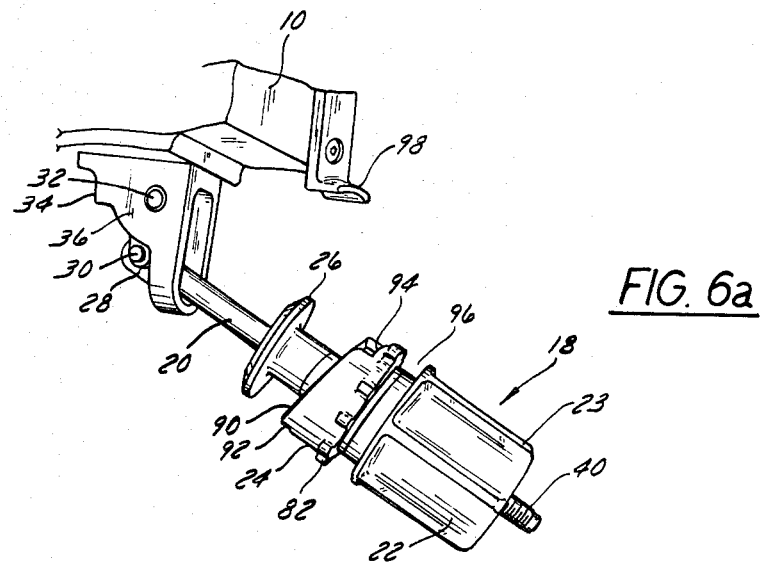
FIG. 6a is an isometric view of the fastener in a free position.

The end of keeper 24 as shown in FIG. 6a facing away from sleeve 22 has a frustro-cylindrical shape which provides a ramp surface 90 which, as described below, serves as a cam in the operation of unit 18.

Figure 6B:
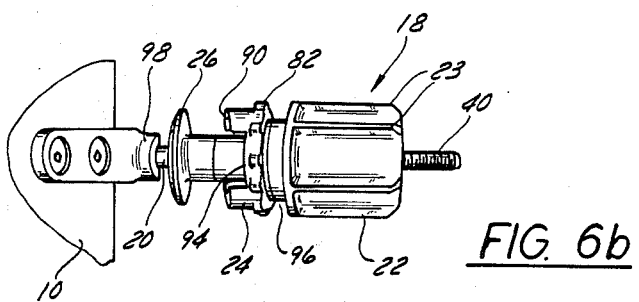
Figure 6C:
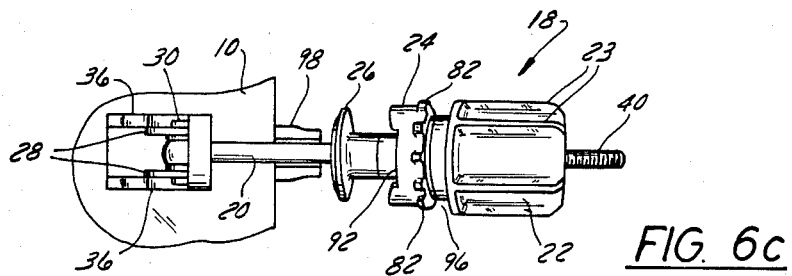

FIGS. 6b and 6c illustrate, respectively, the top and bottom view of fastener 18 of FIG. 6a still in the free state. As can be seen in FIG. 6b, a slot 94 is positioned appropriately to receive hook 98. Diametrically opposed to slot 94 is a second slot 92 cut into the extended portion of ramp surface 90 as seen in FIG. 6c. Slot 92, however, does not extend as deep as slot 94 for an important reason stated below.

Figure 7:
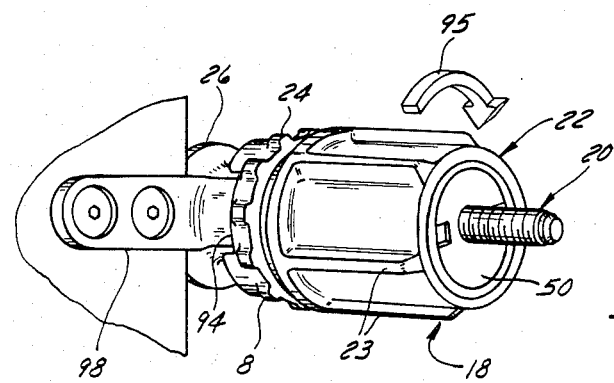
FIG. 7 is still another isometric view of the fastener of the present invention when translated to a position adjacent the hook element.
Figure 8:
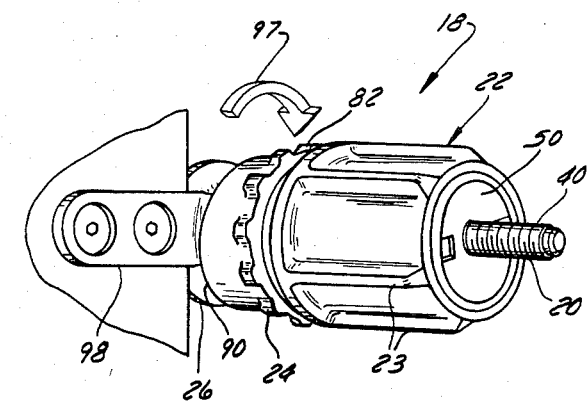
FIG. 8 illustrates an isometric view of the fastener in the position depicted by FIG. 7 about to be secured to the hook element.
Figure 9:
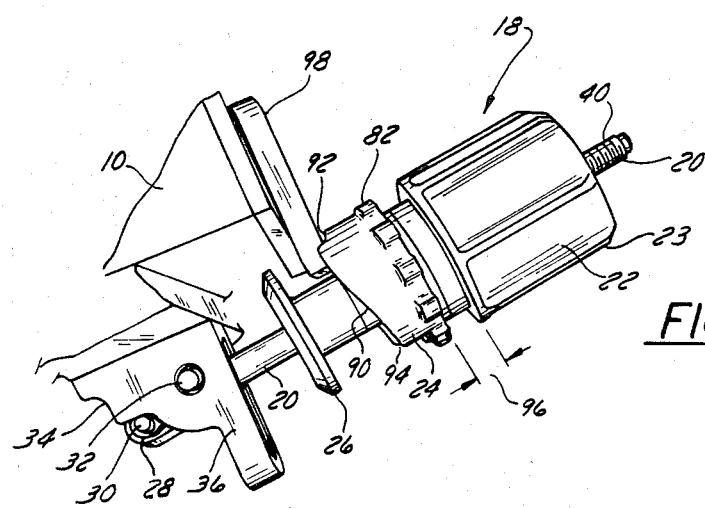
FIG. 9 illustrates isometrically the fastener when secured to the hook element prior to its loaded position.
Figure 10:
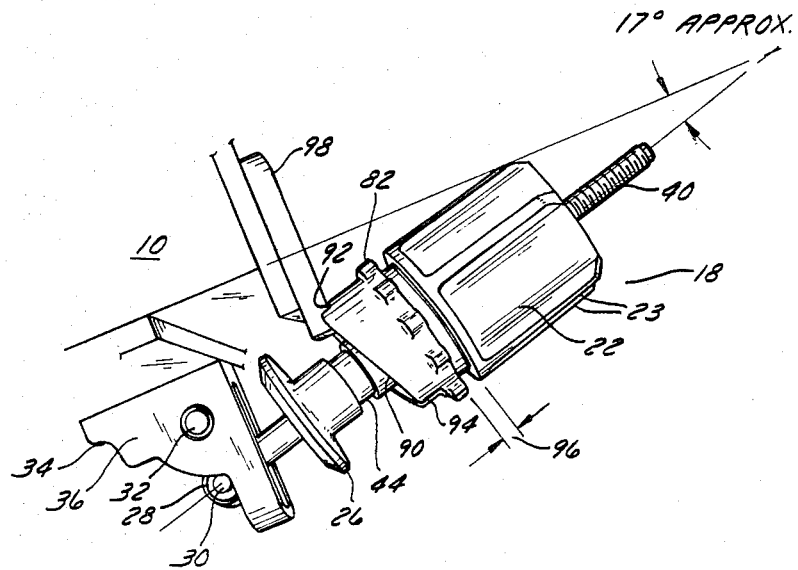
FIG. 10 illustrates isometrically the fastener when in its loaded position.

When sleeve 22 is rotated clock-wise, as illustrated by arrow 95, keeper 24 is translated to the position indicated in FIG. 7. At this position slot 94 and hook 98 are in a proper relationship for engagement through either clock-wise or counter clock-wise rotation of keeper 24. This rotation, shown to be clock-wise in FIG. 8 by arrow 97 causes ramp surface 90 to ride against hook 98. As keeper 24 is rotated into position, curved spring washers 72 deflect under the camming action of surface 90. Gap 96 shown at its maximum width in FIG. 9 becomes narrower and reaches a reduced width just prior to engagement of hook 98 and slot 92. When hook 98 snaps into slot 92, gap 96 increases back to its maximum width. At this position, there is also a small clearance between extractor 26 and the backside of hook 98.

As sleeve 22 is rotated further, keeper 24 begins to exert an increasing load against hook 98. If unit 10 is not positioned properly on supporting shelf 12, the rotation of sleeve 22 causes unit 10 to move into a position in which unit 10 becomes connected to electrical connectors 14. Further rotation of the sleeve causes gap 96 to decrease again and pin 30 of link to abut the underside of latch as most clearly depicted in the isometric view of FIG. 10. In this position the axis of fastener 18 is inclined at about an angle of 17° with the horizontal plane due to the angle that the bearing surface 91 makes with the horizontal plane. At this position, fastener 18 is at its predetermined load limit. Any further rotation of sleeve 22 will cause the slip clutch assembly to become operative to prevent further increase in load and damage to the fastener.

If desired a band of brightly covered material may be placed around the surface of keeper 24 in gap 96. As sleeve 22 moves over keeper 24, the disappearance of the material indicates the approach of a lockable position.

Figure 11:
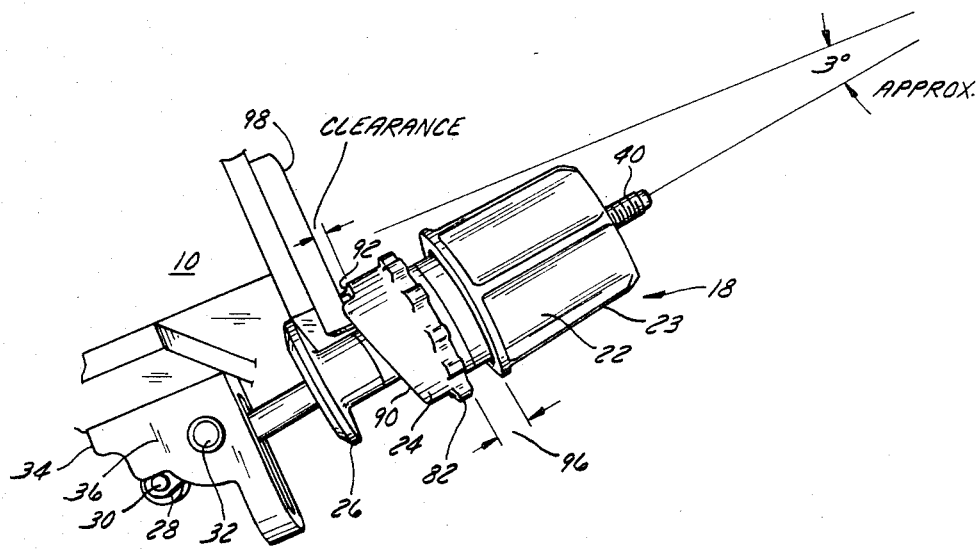
FIG. 11 is an isometric view of the fastener when in its extracted position.

When it is desired to extract unit 10 from shelf 12, sleeve 22 is rotated counter-clockwise. The clutch is instantly engaged, resulting in a positive driving action allowing sleeve 22 to move relative to shaft 44 for a short distance. Then shaft 44 having an abutting relationship with ledge 102 of extractor 26 causes extractor 26 to move toward the backside of hook 98, to abut the same, and then displace unit 10 from its seated position, disconnecting it from connectors 14. As can be seen in FIG. 11, gap 96 is returned to its maximum position. Additionally the angle of incline of fastener 18 with the horizontal is reduced to about 3° because of movement link 28 and pin 30 to position shown. Fastener 18 then can be released to its free state by pulling back on keeper 24 and rotating it in either direction to line up slot 94 with hook 98. At this point, the unit will drop away into its free state.

Other advantages and objects of the invention will be apparent after the reading of the specification herein. Such advantages and objects are intended to be covered within the metes and boundaries of the appended claims.

I claim:

1. An extractor hold down apparatus for use in selectively displacing and securing a unit mounted on a frame structure under a predetermined load, said apparatus including:

a first shaft, at least a portion of which is threaded and having one end thereof adapted to receive a pivot pin;

a second shaft mounted on said first shaft for axial movement along said threaded portion thereof;

drive means including a sleeve mounted on and coupled to said second shaft and a slip clutch means operative in a slip mode when the level of torque between said sleeve and said second shaft exceeds a predetermined amount; and a keeper member rotatably mounted on said second shaft adjacent said drive means and coupled thereto for axial movement therewith;

said sleeve including a portion, adjacent said keeper member, having an inside radius greater than an outside radius of said keeper member adjacent thereto;

said keeper member being an annular cylindrical element and having a plurality of spaced slots adapted to receive a hook member extending from a unit and securing said keeper member when rotated, said element having a frustocylindrical end forming a circular ramp, said ramp having an axially short part and an axially long part in which said plurality of spaced slots are positioned, one of said circumferentially spaced slots being cut deep into said axially short part of said ramp and another of said plurality of circumferentially spaced slots being cut shallow in said axially long part of said ramp;

said drive means further including yieldable means for permitting relative movement between said sleeve and said keeper member, said sleeve and said keeper member having a gap of predetermined maximum width therebetween when the apparatus is not providing a load to the unit.

2. The extractor hold down apparatus of claim 1 wherein said yieldable means has an outer periphery and said keeper member includes an end, opposite said frustocylindrical end, having a projection which contacts said yieldable means outer periphery.

3. An extractor hold down apparatus for use in selectively displacing and securing a unit mounted on a frame structure under a predetermined load, said apparatus including:

a first shaft, at least a portion of which is threaded and having one end thereof adapted to receive a pivot pin;

a second shaft mounted on said first shaft for axial movement along said threaded portion thereof;

drive means including a sleeve mounted on and coupled to said second shaft and a slip clutch means operative in a slip mode when the level of torque between said sleeve and said second shaft exceeds a predetermined amount; and a keeper member rotatably mounted on said second shaft adjacent said drive means and coupled thereto for axial movement therewith;

said sleeve including a portion, adjacent said keeper member, having an inside radius greater than an outside radius of said keeper member adjacent thereto;

said keeper member being an annular cylindrical element having a plurality of spaced slots adapted to receive a hook member extending from a unit and securing said keeper member when rotated, said element having a frustocylindrical end forming a circular ramp, said ramp having an axially short part and an axially long part in which said plurality of spaced slots are positioned, one of said circumferentially spaced slots being cut deep into said axially short part of said ramp and another of said plurality of circumferentially spaced slots being cut shallow in said axially long part of said ramp;

said drive means further including a yieldable means for permitting relative movement between said sleeve and said keeper member, said sleeve and said keeper member having a gap of predetermined maximum width therebetween when the apparatus is not providing a load to the unit, said yieldable means being constructed and arranged to be responsive to rotation of said ramp axially long part against the hook member to permit a reduction in said gap between said sleeve and said keeper member.

4. The extractor hold down apparatus of claim 3 wherein said keeper member is constructed and arranged for rotation in a first direction and in a second opposite direction with the hook member being is partially covered by said keeper member.

5. An extractor hold down apparatus for use in selectively displacing and securing a unit mounted on a frame structure under a predetermined load, said apparatus including:

a first shaft, at least a portion of which is threaded and having one end thereof adapted to receive a pivot pin;

a second shaft mounted on said first shaft for axial movement along said threaded portion thereof;

drive means including a sleeve mounted on and coupled to said second shaft and a slip clutch means operative in a slip mode when the level of torque between said sleeve and said second shaft exceeds a predetermined amount; and a keeper member rotatably mounted on said second shaft adjacent said drive means and coupled thereto for axial movement therewith;

said sleeve including a portion, adjacent said keeper member, having an inside radius greater than an outside radius of said keeper member adjacent thereto;

said keeper member being an annular cylindrical element having a plurality of spaced slots adapted to receive a hook member extending from a unit and securing said keeper member when rotated, said element having a frustocylindrical end forming a circular ramp, said ramp having an axially short path and an axially long part in which said plurality of spaced slots are positioned, one of said circumferentially spaced slots being cut deep into said axially short part of said ramp and another of said plurality of circumferentially spaced slots being cut shallow in said axially long part of said ramp, with said axially long part being constructed to partially cover a portion of the hook member when the apparatus is placed under a predetermined load;

said drive means further including yieldable means for permitting relative movement between said sleeve and said keeper member, said sleeve and said keeper member having a gap of predetermined maximum width therebetween when the apparatus is not providing a load to the unit, said yieldable means being constructed and arranged to be responsive to rotation of said ramp axially long part against the hook member to permit a reduction in said gap between said sleeve and said keeper member.

6. The extractor hold down apparatus of claim 5 wherein a load is applied thereto and said keeper member is precluded from free rotation by the hook member and said shallow cut slot in said axially long part of said ramp.

7. An extractor hold down apparatus for use in selectively displacing and securing a unit mounted on a frame structure under a predetermined load, said apparatus including:
a first shaft, at least a portion of which is threaded and having one end thereof adapted to receive a pivot pin;
a second shaft mounted on said first shaft for axial movement along said threaded portion thereof;
drive means including a sleeve mounted on and coupled to said second shaft and a slip clutch means operative in a slip mode when the level of torque between said sleeve and said second shaft exceeds a predetermined amount; and
a keeper member rotatably mounted on said second shaft adjacent said drive means and coupled thereto for axial movement therewith;
said sleeve including a portion, adjacent said keeper member, having an inside radius greater than an outside radius of said keeper member adjacent thereto;
said keeper member being an annular cylindrical element having a plurality of spaced slots adapted to receive a hook member extending from a unit and securing said keeper member when rotated, said element having a frustocylindrical end forming a circular ramp, said ramp having an axially short part and an axially long part in which said plurality of spaced slots are positioned, one of said circumferentially spaced slots being cut deep into said axially short part of said ramp and another of said plurality of circumferentially spaced slots being cut shallow in said axially long part of said ramp;
said shallow cut slot and the hook member preventing free rotation of said keeper member when a load is applied, with said ramp axially long part being constructed to partially cover a portion of the hook member when said apparatus is placed under a predetermined load;
said drive means further including yieldable means for permitting relative movement between said sleeve and said keeper member, said sleeve and said keeper member having a gap of predetermined maximum width therebetween when the apparatus is not providing a load to the unit, said yieldable means being constructed and arranged to be responsive to rotation of said ramp axially long part against the hook member to permit a reduction in said gap between said sleeve and said keeper member, and said keeper member having a bearing surface inside said ramp axially long part, said bearing surface being inclined at a predetermined angle with a horizontal plane and arranged to bear against the hook member.

8. An extractor hold down apparatus for use in selectively displacing and securing a unit mounted on a frame structure under a predetermined load, said apparatus including:
a first shaft, at least a portion of which is threaded and having one end thereof adapted to receive a pivot pin;
a hollow drive shaft mounted on said first shaft for axial movement along said threaded portion thereof;
drive means including a sleeve mounted on and coupled to said hollow drive shaft and a slip clutch means operative in a slip mode when the level of torque between said sleeve and said second shaft exceeds a predetermined amount;
a keeper member rotatably mounted on said hollow drive shaft adjacent said drive means and coupled thereto for axial movement therewith; and
an extractor member mounted on said hollow drive shaft adjacent said keeper member for axial movement with said hollow drive shaft and adapted to abut against a surface of the hook member whereby said extractor member moves the unit in an axial direction when said sleeve and said hollow drive shaft move in that axial direction;
said sleeve including a portion, adjacent said keeper member, having an inside radius greater than an outside radius of said keeper member adjacent thereto;
said keeper member being an annular cylindrical element having a plurality of spaced slots adapted to receive a hook member extending from a unit and securing;
said keeper member when rotated, said element having a frustocylindrical end forming a circular ramp, said ramp having an axially short part and an axially long part in which said plurality of spaced slots are positioned, one of said circumferentially spaced slots being cut deep into said axially short part of said ramp and another of said plurality of circumferentially spaced slots being cut shallow in said axially long part of said ramp;
said shallow cut slot and the hook member preventing free rotation of said keeper member when a load is applied, with said ramp axially long part being constructed to partially cover a portion of the hook member when said apparatus is placed under a predetermined load;
said drive means further including yieldable means for permitting relative movement between said sleeve and said keeper member, said sleeve and said keeper member having a gap of predetermined maximum width therebetween when the apparatus is not providing a load to the unit, with said yieldable means being constructed and arranged to be responsive to rotation of said ramp axially long part against the hook member to permit a reduction in said gap between said sleeve and said keeper member, and said keeper member.

* * * * *